United States Patent [19]
Matsuno

[11] Patent Number: 5,874,779
[45] Date of Patent: Feb. 23, 1999

[54] SEMICONDUCTOR DEVICE WITH IMPROVED ADHESION BETWEEN TITANIUM-BASED METAL WIRING LAYER AND INSULATION FILM

[75] Inventor: Tadashi Matsuno, Yokohama, Japan

[73] Assignee: Kabushiki Kaisha Toshiba, Tokyo, Japan

[21] Appl. No.: 969,647

[22] Filed: Nov. 13, 1997

Related U.S. Application Data

[62] Division of Ser. No. 519,892, Aug. 28, 1995, Pat. No. 5,753,975.

[30]      Foreign Application Priority Data

Sep. 1, 1994  [JP]  Japan ...................................... 6-208728
Mar. 20, 1995  [JP]  Japan ...................................... 7-085989

[51] Int. Cl.⁶ ................................................. H01L 23/522
[52] U.S. Cl. .......................... 257/758; 257/758; 257/763; 438/622; 438/624; 438/648
[58] Field of Search .................... 257/758, 753, 257/763; 438/624, 622

[56]         References Cited

U.S. PATENT DOCUMENTS 5,334,552  8/1994  Homma .................................. 438/624
5,612,557  3/1997  Kondo ..................................... 257/288

FOREIGN PATENT DOCUMENTS 596364  5/1994  European Pat. Off. .
599730  6/1994  European Pat. Off. .

OTHER PUBLICATIONS

International Conference on Solid State Devices and Materials, Aug. 21, 1996, pp. 608–610.
Electrochemical Society, Inc., *Journal of the Electrochemical Society*, vol. 140, No. 3, Mar. 1993, pp. 687–692.
Institute of Electrical and Electronics Engineers Electron Devices Society, *1994 Symposium on VLSI Technology Digest of Technical Papers*, Honolulu, Jun. 7–9, 1994, pp. 59/60.

*Primary Examiner*—Olik Chaudhuri
*Assistant Examiner*—Edwin Oh
*Attorney, Agent, or Firm*—Loeb & Loeb LLP

[57]           ABSTRACT

A semiconductor device includes a substrate, an insulation film formed above the substrate and containing silicon-fluorine bonds, and a titanium-based metal wiring layer formed on the insulation film, the titanium-based metal wiring layer containing fluorine which is diffused from the insulation film and has a fluorine concentration of less than $1 \times 10^{20}$ atoms/cm³.

1 Claim, 12 Drawing Sheets

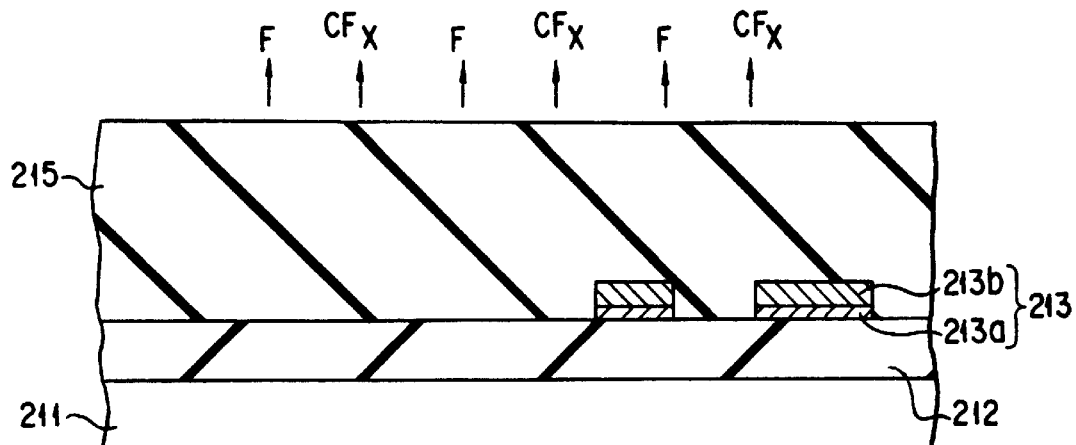
F I G. 7B
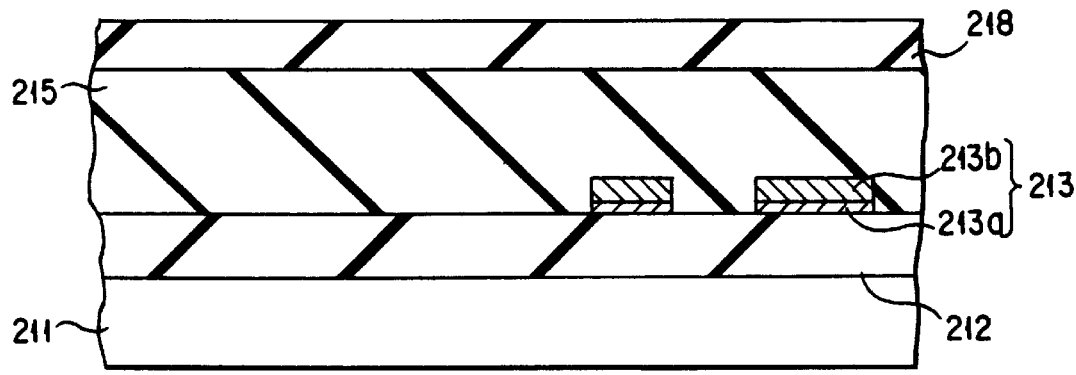
F I G. 7C
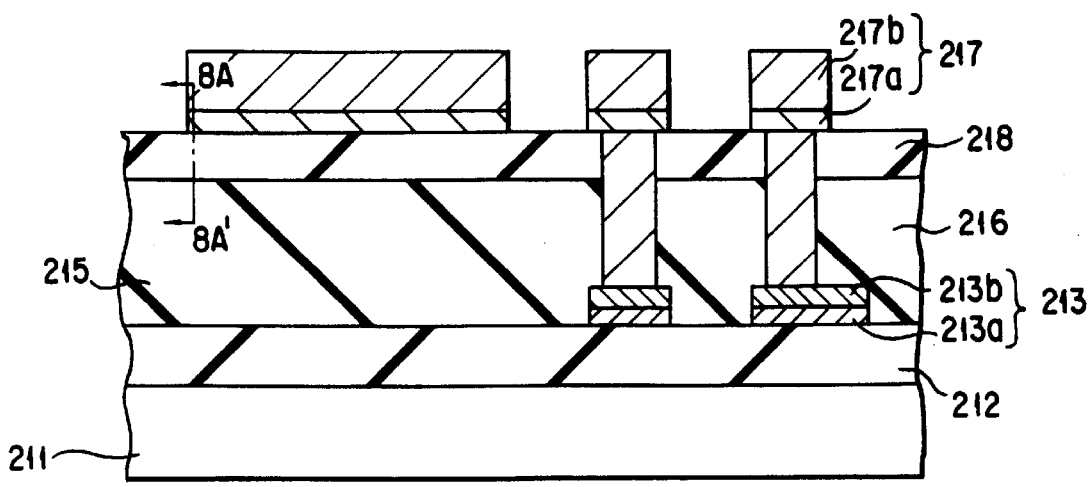
F I G. 7D

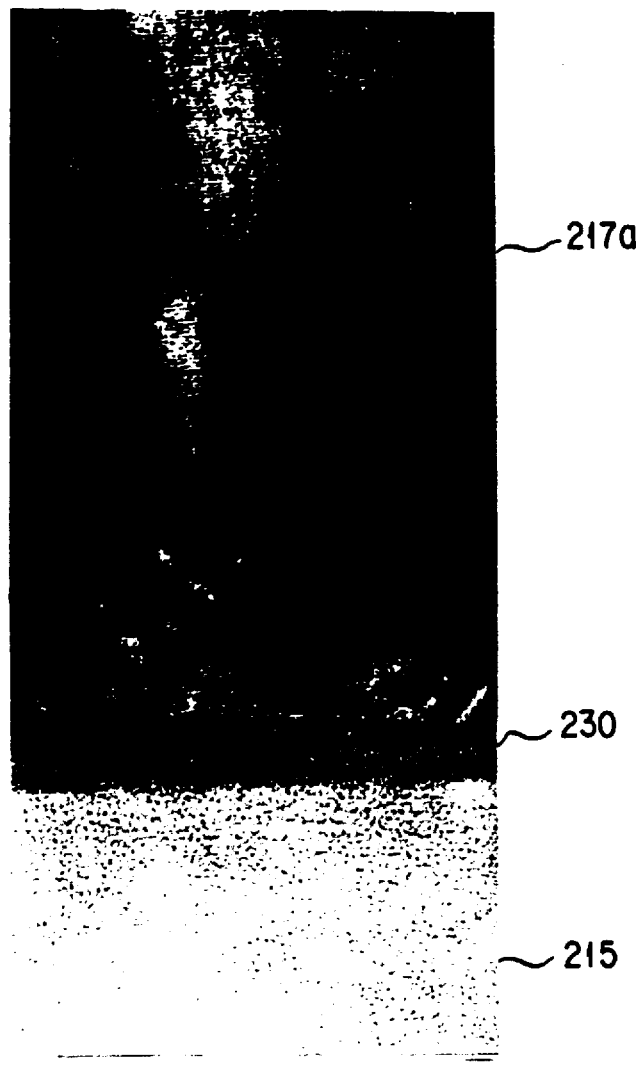
F I G. 16

SEMICONDUCTOR DEVICE WITH IMPROVED ADHESION BETWEEN TITANIUM-BASED METAL WIRING LAYER AND INSULATION FILM

This is a division application of application Ser. No. 08/519,892 filed on Aug. 28, 1995, now U.S. Pat. No. 5,753,975.

BACKGROUND OF THE INVENTION

1. Field of the Invention

The present invention relates to a semiconductor device having a titanium-based metal wiring layer on an insulation film and, more particularly, to a semiconductor device having improved adhesion properties between the wiring layer and the insulation film and a method of manufacturing the same.

2. Description of the Related Art

In recent years, with the higher integration for integrated circuits, and demands for high-speed operations, suppression of wiring capacitance in an integrated circuit has become a serious problem. When the wiring interval is on an order of submicrons, the capacitance between interconnections abruptly increases to prolong the propagation delay of a signal. Particularly, in a high-speed logic circuit used for a CPU and the like, wiring on a chip is multi-layered. Extensive studies have been made for demanding an insulation film having a low dielectric constant suitable for an integrated circuit chip.

As a conventional insulation film for an integrated circuit, a silicon oxide film ($SiO_2$) is widely used. The dielectric constant of a silicon oxide film formed by general CVD is about 4.2 to 5.0. To decrease this dielectric constant to substantially half, an organic polymer (a dielectric constant of 2.0 to 3.1) is known. The organic polymer, however, has problems of insufficient thermal stability and difficult patterning.

Recently, it is examined to form an insulation film (a dielectric constant of 3.0 to 3.6) containing Si-F bonds by adding fluorine (F) into a silicon oxide film and to decrease the dielectric constant of the insulation film. An insulation film containing Si-F bonds is a material which receives attention for its excellent burying properties in a multi-layered interconnection. By trapping fluorine into an oxide film, an insulation film having a low dielectric constant can be realized. This is reported in, e.g., "Reduction of Wiring Capacitance with New Low Dielectric SiOF Interlayer Film for High Speed/Low Power Sub-half Micron CMOS" (J. Ida et al., 1994 Symposium on VLSI (p. 59)). This reports that the propagation delay time (tpd) of a 0.35-fm CMOS 2NAND gate was improved 13% in an interconnection with an insulation film (a dielectric constant of 3.6) containing Si-F bonds in comparison with an interconnection with a normal CVD oxide film (a dielectric constant of 4.3).

In this manner, an insulation film containing Si-F bonds has a low dielectric constant and an effect of decreasing wiring capacitance. On the other hand, this insulation film has a drawback of insufficient adhesion properties with a refractory metal wiring layer to cause peel-off of the wiring layer. The situation will be described with reference to the accompanying drawing.

FIG. 1 is a partial sectional view showing a semiconductor device having a two-layered interconnection formed on its surface. More specifically, a semiconductor element (not shown) is formed on the surface of a silicon substrate 111, and its entire upper surface is covered with a first insulation film 112 consisting of silicon oxide. A wiring underlayer 113a consisting of titanium (Ti) is formed on the surface of the first insulation film 112. A main wiring layer 113b made of Cu, Al-Si-Cu, or the like is stacked on the wiring underlayer 113a, and these stacked layers form a first metal interconnection 113. By adopting the two-layered structure in this manner, the mechanical strength with respect to disconnection and the like can be enhanced without increasing the electrical resistance of an interlayer. This first wiring layer is connected to the semiconductor element (not shown) formed on the substrate 111 through a via conductor (not shown).

A second insulation film 115 of silicon dioxide ($SiO_2$) containing Si-F bonds is formed on the entire surface of the first metal interconnection 113. Via holes are partially formed on the first metal interconnection 113, and plugs 116 made of tungsten (W) are buried in these via holes. A second wiring underlayer 117a of titanium (Ti) and a second main wiring layer 117b of Cu, Al-Si-Cu, or the like are stacked on this second insulation film 115 to form a second metal interconnection 117. A third insulation film 119 consisting of silicon dioxide ($SiO_2$) is formed on this structure.

In the semiconductor device manufactured in this manner, the second metal interconnection 117 on the surface may peel off from the second insulation layer 115 due to a residual thermal stress generated in the wiring layer and a mechanical impact during bonding. It is considered that this peel-off is caused by poor adhesion properties between the insulation layer 115 containing Si-F bonds and the titanium wiring underlayer 117a.

As described above, in the semiconductor device having an insulation film containing Si-F bonds and a titanium wiring layer, the adhesion properties at the interface between the titanium wiring layer and the insulation film are degraded. Consequently, the metal wiring film is caused to peel off due to a thermal stress generated in the metal wiring film and a mechanical stress during bonding.

SUMMARY OF THE INVENTION

It is an object of the present invention to provide a semiconductor device having high reliability without causing peel-off of a metal wiring film, and a method of manufacturing the same.

In order to achieve the above object, according to the first aspect of the present invention, a semiconductor device comprises: a substrate; an insulation film formed above the substrate and containing silicon-fluorine bonds; and a titanium-based metal wiring layer formed on the insulation film, the titanium-based metal wiring layer containing fluorine which is diffused from the insulation film and has a concentration of less than $1 \times 10^{20}$ atoms/$cm^3$.

SIMS (Secondary Ion Mass Spectrometry) analysis is used for measurement of the fluorine concentration in the refractory metal. TiF is used as a detection ion for quantitative analysis of fluorine in the titanium layer. A Model 6600 available from Perkin Elmer is used for the SIMS. The measurement is carried out under the condition wherein the ionization energy of $Cs^+$ions is 5 keV.

According to the second aspect of the present invention, a semiconductor device comprises: a substrate; an insulation film formed above the substrate and containing silicon-fluorine bonds; a titanium-based metal wiring layer formed on the insulation film; and a reaction layer formed between the insulation film and the titanium-based metal wiring layer and containing at least titanium, silicon, and oxygen, wherein the reaction layer has, at least on a central portion of the reaction layer in a direction of film thickness, a region in which ratios of a titanium concentration to a silicon concentration and an oxygen concentration are not more than 1, respectively.

According to the third aspect of the present invention, a semiconductor device comprises: a substrate having a first and a second region; a first insulating film formed above the substrate and containing silicon-fluorine bonds, the first insulating film having a first thickness on the first region and having a second thickness greater than the first thickness on the second region; a titanium-based metal wiring layer formed on the first insulating film; and a second insulating film at least formed on the wiring layer and having an opening for wire bonding on the wiring layer above the first region of the substrate.

According to the present invention, a method of manufacturing a semiconductor device comprises the steps of: forming an insulation film containing silicon-fluorine bonds above a substrate; performing annealing of the insulation film to diffuse free fluorine and a fluorine compound outside the insulation film; and forming a titanium-based metal wiring layer on the insulation film.

When a titanium-based refractory metal wiring layer is formed on an insulation film containing silicon-fluorine bonds directly or through another insulation film, fluorine in the insulation film is diffused to the titanium-based metal wiring layer in the sequential annealing step or the like. The diffused fluorine forms TiF, $Ti_xF_y$, and at the same time forms $Si_xF_y$, $Si_xF_yO_z$, $Si_xF_yC_z$, and the like in the wiring layer or at the interface between the wiring layer and the insulation film. In addition, a reaction layer consisting of $Ti_xSi_yO_z$ is formed at the interface. These products degrade the adhesion properties between the insulation layer and the titanium-based wiring layer. Particularly, when the fluorine concentration in the titanium-based wiring layer is $1 \times 10^{20}$ atoms/cm$^3$ or more, or when the ratios of Ti to Si and O are higher in the reaction layer, the adhesion properties are greatly degraded.

In the semiconductor device of the present invention, after deposition of the insulation film, free fluorine having no bond radicals, fluorine ions, and $Si_xF_y$, $C_xF_y$, $Si_xF_yO_z$, $Si_xF_yC_z$, $H_xF_y$, and the like which are low in bond energy are removed from the insulation film by a means such as heating. Then, the titanium-based refractory metal wiring layer is formed, so that only stabilized SiF is held in the insulation film. In particular, the fluorine concentration can be set to be less than $1 \times 10^{20}$ atoms/cm$^3$.

The composition of the reaction layer formed at the interface between the wiring layer for bonding wire connection and the insulation film after deposition of the insulation film is set such that the element composition ratios of Ti to Si and O are 1 or less by suppressing the diffusion amount of F. With this operation, the adhesion properties at the interface can be greatly improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 7A to 7D are sectional views of the semiconductor device showing a manufacturing method step by step according to the second embodiment of the present invention;

FIG. 16 is a photomicrograph showing a reaction layer formed at the interface between an insulation layer and a metal wiring underlayer;

DETAILED DESCRIPTION OF THE PREFERRED EMBODIMENTS

Figure 1:
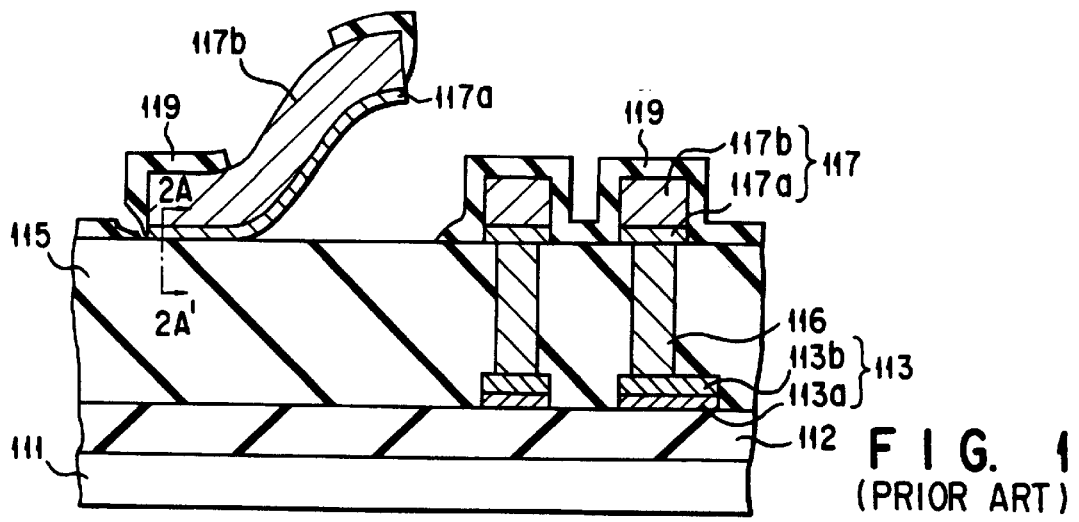
FIG. 1 is a sectional view showing the main part of a semiconductor device according to the prior art for explaining peel-off of a metal interconnection.

The preferred embodiments will be described below with reference to the accompanying drawings. The same reference numerals denote the same parts throughout the following embodiments, and a repetitive description thereof will be omitted.

(First Embodiment)

Figure 3:
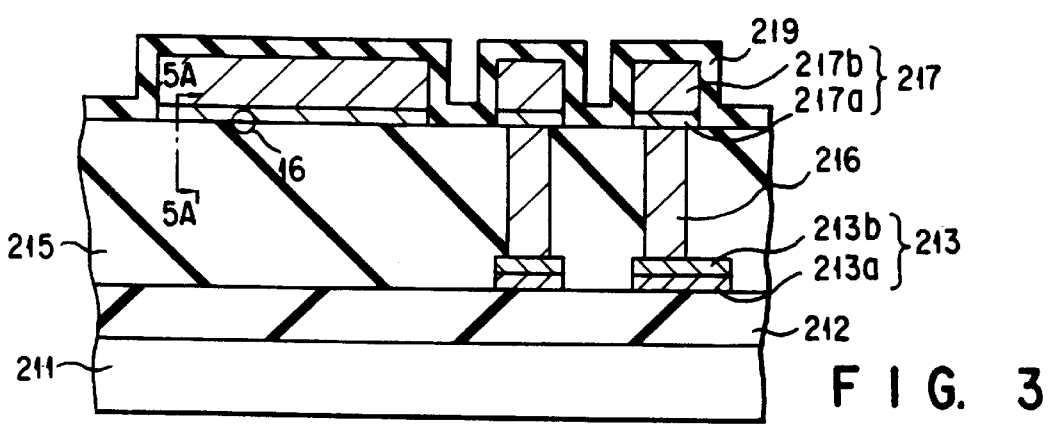
FIG. 3 is a sectional view showing the main part of a semiconductor device according to the first embodiment of the present invention.

FIG. 3 is a sectional view showing a metal interconnection portion of a semiconductor device according to the first embodiment of the present invention. Referring to FIG. 3, a first insulation film ($SiO_2$) 212 is formed on an Si substrate 211, and a first metal interconnection 213 is partially formed on the surface of the first insulation film 212. This metal interconnection 213 is an interconnection of a multi-layered structure constituted by a titanium-based metal underlayer 213a and a main wiring layer 213b of, e.g., an Al-Cu-Si alloy. A second insulation film 215 is formed in the remaining region of the first insulation film 212. This insulation film 215 is an $SiO_2$ film containing Si-F bonds. Plugs 216 consisting of, e.g., tungsten (W) as a via conductor are formed on the metal interconnection 213, and electrodes are extracted to the surface of the second insulation film 215.

A second metal interconnection 217 is formed on the insulation film 215, and part of the second metal interconnection 217 is connected to the plugs 216. This metal interconnection 217 is a titanium-based metal wiring layer of a multi-layered structure constituted by a titanium-based metal underlayer 217a and a main wiring layer 217b of, e.g., an Al-Cu-Si alloy. The insulation film 215 and the metal interconnection 217 are covered with a third insulation film (passivation film) 219 to form a surface metal interconnection portion.

Figure 4A:
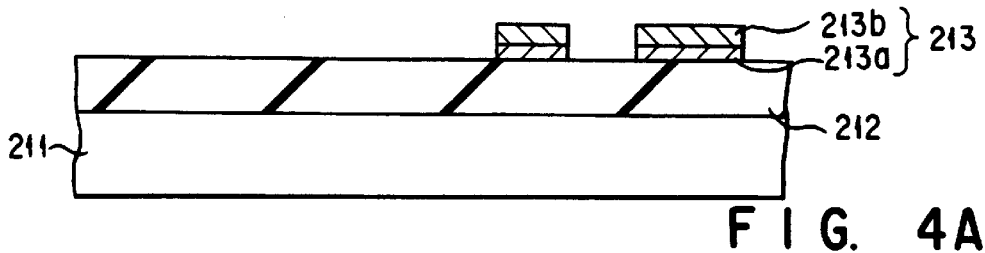
FIGS. 4A to 4D are sectional views of the semiconductor device showing a manufacturing method step by step according to the first embodiment of the present invention.

The above semiconductor device is manufactured according to the following method. First, as shown in FIG. 4A, an $SiO_2$ film as the first insulation film 212 is deposited to a thickness of 1,500 nm on the Si substrate 211 using TEOS (tetraethylorthosilicate) gas and oxygen ($O_2$) gas in a low-pressure plasma. In this case, $O_3$ gas may be used instead of the $O_2$ gas. With the $O_3$ gas, an $SiO_2$ film having more excellent self-planarization characteristics can be obtained. Next, Ti and TiN are sequentially deposited to thicknesses of 50 nm and 70 nm by sputtering for the refractory wiring underlayer 213a which constitutes the first metal interconnection. In this case, the CVD method can be used instead of the sputtering method. An Al-Cu-Si alloy for the main wiring layer 213b is deposited to a thickness of 600 nm on this wiring underlayer 213a by the sputtering method to form the metal wiring layer of the multi-layered structure. Note that examples of the material of the main wiring layer 213b may be Cu, a Cu alloy, W, and a W alloy. Subsequently, this metal wiring layer of the multi-layered structure is processed by the lithography technique and the RIE (Reactive Ion Etching) technique to form the first metal interconnection 213.

Figure 4B:
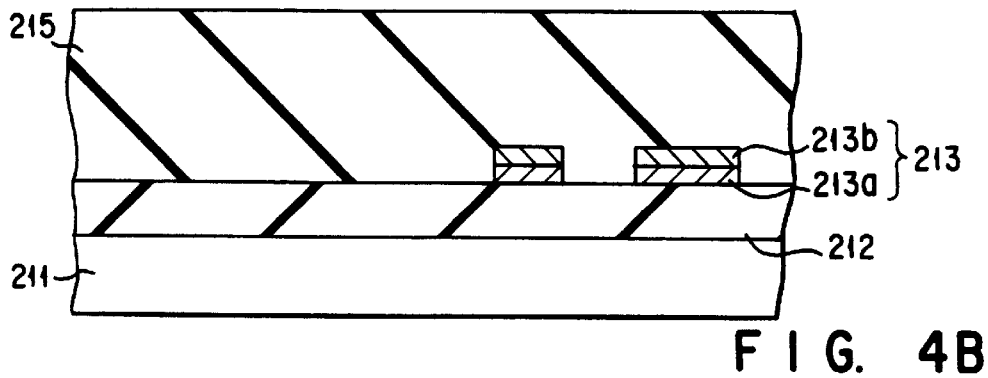

Then, as shown in FIG. 4B, an $SiO_2$ film containing fluorine as the second insulation film 215 containing Si-F bonds is deposited to a thickness of 2,500 nm using TEOS gas, $O_2$ gas, and a nitrofluoride ($NF_x$) gas in a low-pressure plasma. As a film formation gas for the CVD $SiO_2$ film to be used here, inorganic $SiH_4$ or the like may be used instead of TEOS. In this case, a carbon fluoride ($C_xF_y$), a silicon fluoride ($Si_xF_y$), or the like may be used instead of the nitrofluoride. The second insulation film 215 contains Si-F bonds, multiple bonds such as Si-F-C bonds, and free fluorine having no bond radical. Thereafter, the surface of this insulation film is planarized by the resist etch-back RIE technique. In this case, the surface may be planarized using the CMP (Chemical Mechanical Polishing) technique.

Figure 4C:
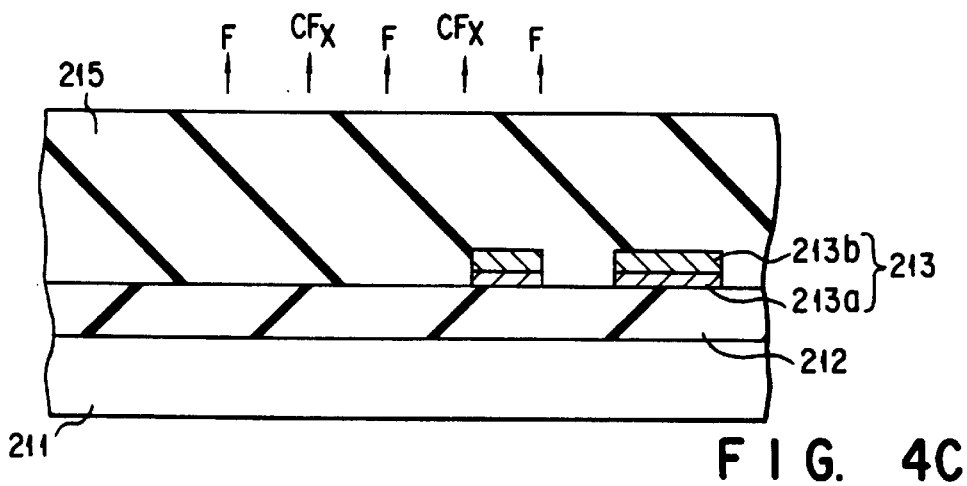

The obtained structure is introduced into a furnace in a nitrogen atmosphere at 450° C. to anneal it for 15 minutes. A multiple bond in the second insulation film 215 has a lower bond energy than that of an Si-F bond and thus is in an unstable bond state. As a result of this annealing, such polymer bonds, e.g., Si-F-C bonds are separated to generate $CF_x$, and generated $CF_x$ and free fluorine are diffused outside the insulation film 215 (FIG. 4C).

This removal process of free fluorine can be performed within a short period of time by, e.g., lamp annealing with an infrared lamp at 600° C. for 20 seconds. Alternatively, this process may be performed by low-pressure plasma discharge at 200° C. In this case, oxygen gas, nitrogen gas, argon gas, or the like can be used for the atmosphere.

Figure 4D:
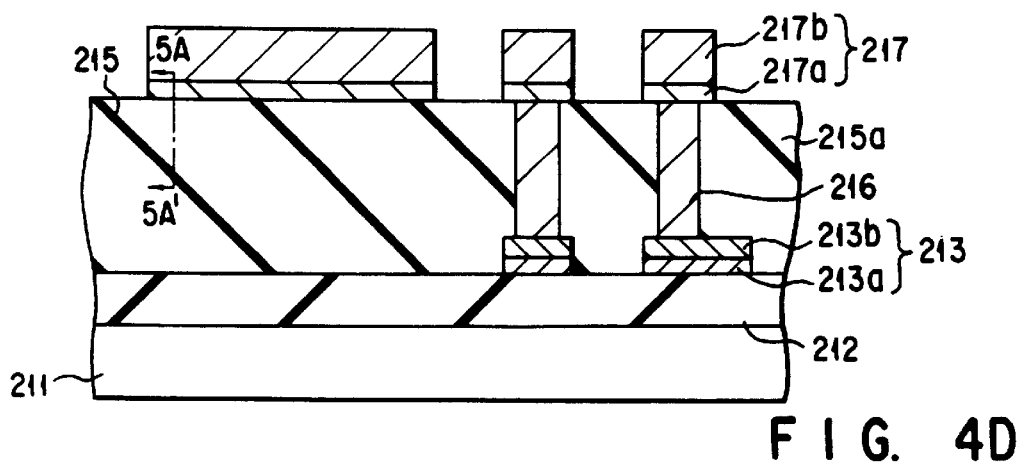

Next, as shown in FIG. 4D, the via holes are opened for connecting the first metal interconnection 213 to the second metal interconnection 217. Tungsten is selectively deposited in the via holes using $WF_6$ and $SiH_4$ gases to form the plugs 216. Similar to the first wiring underlayer 213a, Ti and TiN for the second metal underlayer 217a are sequentially deposited to film thicknesses of 50 nm and 70 nm by the sputtering method. An Al-Cu-Si alloy for the main wiring layer 217b is deposited to a thickness of 1,200 nm on this wiring underlayer 217a by the sputtering method to form the metal wiring layer of the multi-layered structure. Note that examples of the material of the main wiring layer 217b may be Cu, a Cu alloy, tungsten, and a tungsten alloy. Subsequently, this metal wiring layer of the multi-layered structure is processed by the lithography technique and the RIE (Reactive Ion Etching) technique to form the second metal interconnection 217. The obtained structure is annealed in an annealing step at 450° C. for 5 minutes.

The third insulation film 219 is deposited to a thickness of 400 nm using TEOS and oxygen ($O_2$) gases in a low-pressure plasma at 400° C. An opening for connecting a lead wire or a bonding wire is formed by the lithography and RIE techniques. In this case, this opening may be formed using a chemical such as $NH_4F$ or the like. As a result, the surface metal interconnection portion is obtained as shown in FIG. 3 (note that the opening for a lead wire connection is not illustrated).

Figure 5:
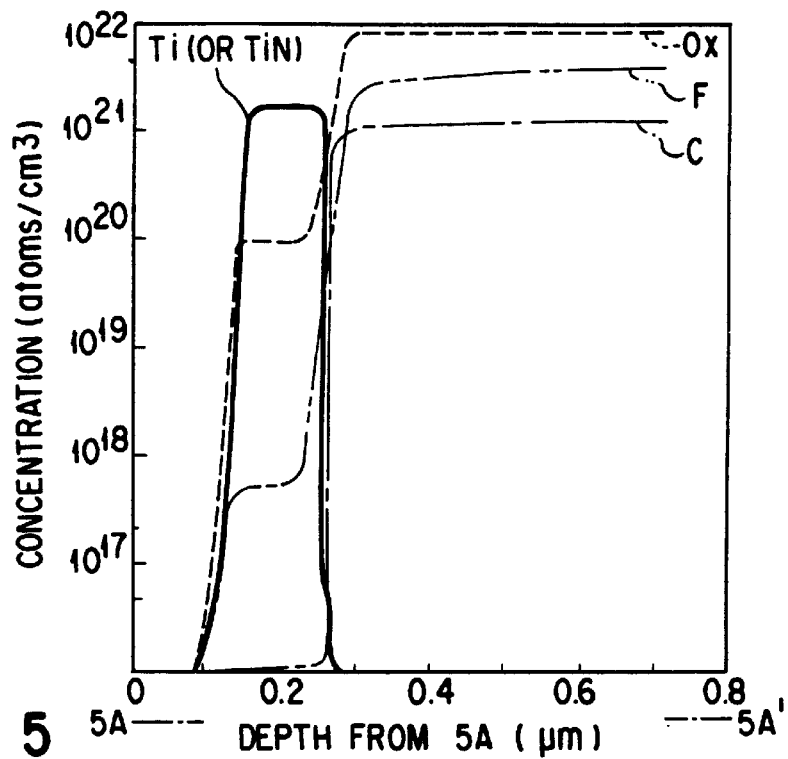
FIG. 5 is a graph showing the concentration profiles of constituent elements on a section taken along a line 5A—5A' in FIG. 3.

FIG. 5 shows the concentration distribution of constituent elements (Ti, F, C, and $O_x$) on a section indicated by a broken line 5A—5A' near the interface between the second metal interconnection 217 and the second insulation film 215, which are obtained in the above manner. The abscissa in FIG. 5 represents the depth from 5A in the direction along the line 5A—5A', and the ordinate represents the concentration of each constituent element. A region where titanium shows a high concentration is the underlayer 217a portion, while a region where carbon (C) shows a high concentration is the second insulation film 215 region. At the depth at which titanium contacts carbon (0.26 $\mu$m in this case; note that the absolute value is of no significance), the interface between the underlayer 217a and the second insulation layer 215 is present. It should be noted that the concentration of fluorine in a region sufficiently spaced apart from the interface of the underlayer 217a (more specifically, a region of a titanium nitride film spaced apart from the interface by 50 nm or more) is about $5 \times 10^{17}$ atoms/cm$^3$, which is extremely less than the fluorine concentration in the second insulation film (about $5 \times 10^{21}$ atoms/cm$^3$). Also, the fluorine concentration at the interface is as low as about $5 \times 10^{19}$ atoms/cm$^3$.

Note that this concentration distribution was obtained by measurement in a state of FIG. 3, wherein the third insulation film 219 was formed. It was also confirmed that the same result was obtained on the section taken along a line 5A—5A' in FIG. 4D, wherein the third insulation film 219 was not formed yet.

Figure 2:
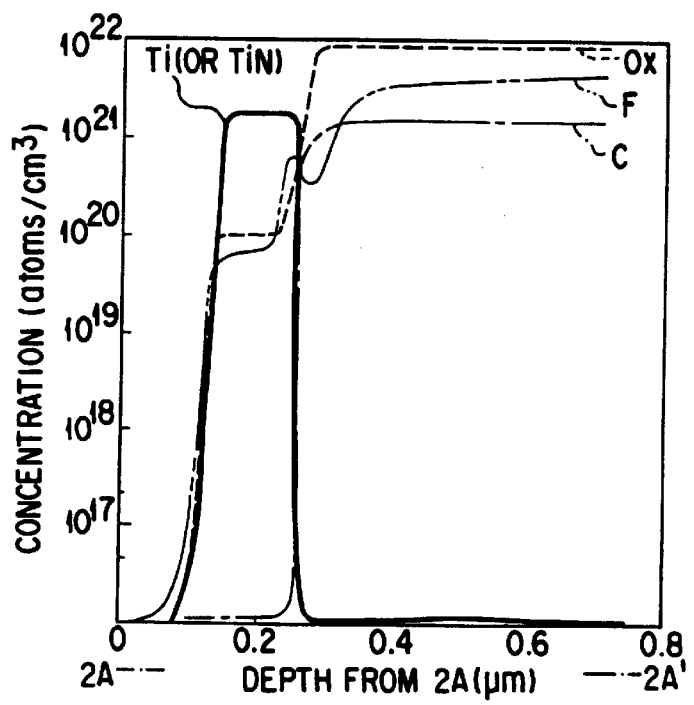
FIG. 2 is a graph showing the concentration profiles of constituent elements on a section taken along a line 2A—2A' in FIG. 1.

The semiconductor device having such a concentration distribution and the semiconductor device described in the prior art (i.e., the semiconductor device described with reference to FIGS. 1 and 2) were subjected to an ultrasonic bonding test. A metal wire 25 $\mu$m in diameter was bonded between a bonding pad (50×80 $\mu$m) having the same arrangement as that of the second metal interconnection 217 on an IC chip and a terminal of a packaging part on which the IC chip is mounted with a predetermined ultrasonic output and a predetermined load. A tensile test was conducted on 100 bonding wires to check the presence of peel-off defects generated at the interface between the bonding pad and the insulation film 215. As a result, there was no peel-off defect. Consequently, it was apparent that the adhesion properties between the metal wiring underlayer 217a and the insulation film 215 could be increased by the fluorine concentration to less than $1 \times 10^{20}$ atoms/cm$^3$ in the range where a titanium-based metal had the highest concentration. If the diffusion of fluorine to the interconnection 217 is completely suppressed, the ideal condition can be realized. The lower limit of the fluorine concentration may be substantially 0.

(Second Embodiment)

Figure 6:
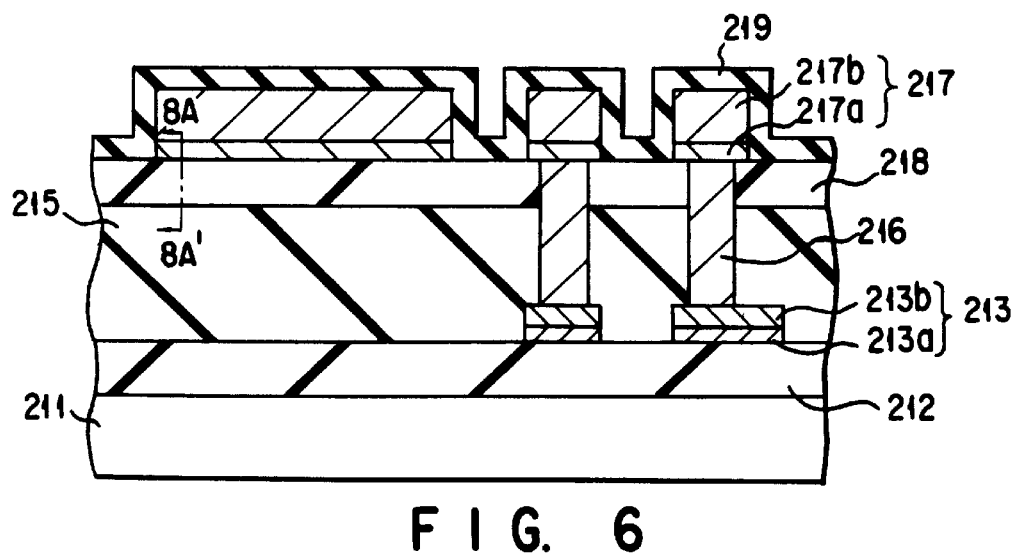
FIG. 6 is a sectional view showing the main part of a semiconductor device according to the second embodiment of the present invention.

FIG. 6 is a sectional view showing a metal interconnection portion of a semiconductor device according to the second embodiment of the present invention. Referring to FIG. 6, a first insulation film (SiO$_2$) 212 is formed on a silicon substrate 211, and a first metal interconnection 213 is partially formed on the surface of the first insulation film 212. This metal interconnection 213 is an interconnection of a multi-layered structure constituted by a titanium-based metal underlayer 213a and a main wiring layer 213b of, e.g., an Al-Cu-Si alloy. A second insulation film 215 is formed in the remaining region of the first insulation film 212. This insulation film 215 is an SiO$_2$ film containing Si-F bonds 215a. The characteristic feature of this embodiment is that a third insulation film 218 is formed on this insulation film 215. In film formation, fluorine is not doped in this third insulation film 218. Plugs 216 consisting of, e.g., tungsten (W) as a via conductor are formed on the metal interconnection 213, and electrodes are extracted to the surface of the third insulation film 218 through the second insulation film 215 and the third insulation film 218.

A second metal interconnection 217 is formed on the third insulation film 218, and part of the second metal interconnection 217 is connected to the plugs 216. This metal interconnection 217 is an interconnection of a multi-layered structure constituted by a titanium-based metal underlayer 217a and a conductor 217b of, e.g., an Al-Cu-Si alloy. The insulation film 215 and the metal interconnection 217 are covered with a fourth insulation film (passivation film) 219 to form a surface metal interconnection portion.

Figure 7A:
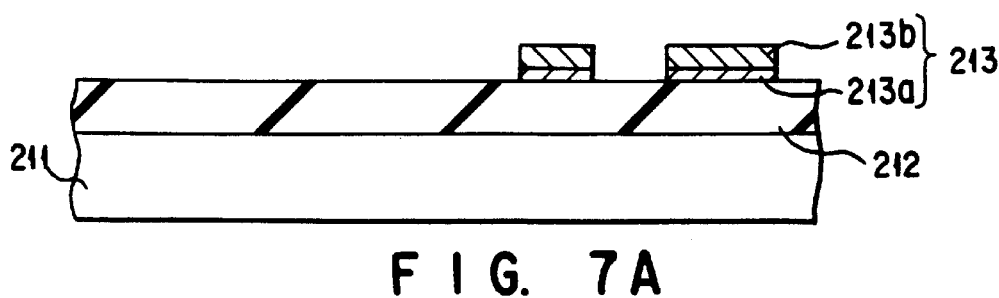

The above semiconductor device is manufactured according to the following method. First, as shown in FIG. 7A, an SiO$_2$ film as the first insulation film 212 is deposited to a thickness of 1,500 nm on the silicon substrate 211 using TEOS and oxygen (O$_2$) gases in a low-pressure plasma. Next, Ti and TiN are sequentially deposited to film thicknesses of 50 nm and 70 nm by the sputtering method for the refractory wiring underlayer 213a, which constitutes the first metal interconnection. An Al-Cu-Si alloy for the main wiring layer 213b is deposited to a thickness of 600 nm on this wiring underlayer 213a by the sputtering method to form the metal wiring layer of the multi-layered structure. Subsequently, this metal wiring layer of the multi-layered structure is processed by the lithography and RIE techniques to form the first metal interconnection 213.

Then, as shown in FIG. 7B, an SiO$_2$ film containing fluorine as the second insulation film 215 containing Si-F bonds is deposited to a thickness of 2,500 nm using TEOS gas, oxygen (O$_2$) gas, and a nitrofluoride (NF$_x$) gas in a low-pressure plasma, similar to the first embodiment. The second insulation film 215 contains Si-F bonds, multiple bonds such as Si-F-C bonds, and free fluorine having no bond radical. Thereafter, the surface of this insulation film is planarized by the resist etching-back RIE technique.

The obtained structure is introduced into a furnace in a nitrogen atmosphere at 450° C. to anneal it for 15 minutes. A multiple bond in the second insulation film 215 has a lower bond energy than that of an Si-F bond and thus is in an unstable bond state. As a result of this annealing, such polymer bonds, e.g., Si-F-C bonds are separated to generate CF$_x$, and generated CF$_x$ and free fluorine are diffused outside the insulation film 215.

Subsequently, as shown in FIG. 7C, the third insulation film 218 is deposited to a thickness of 300 nm using TEOS and oxygen (O$_2$) gases in a low-pressure plasma. As a film formation gas for the CVD SiO$_2$ film to be used here, inorganic SiH$_4$ may be used instead of TEOS. Further, O$_3$ gas may be used instead of the O$_2$ gas.

Next, as shown in FIG. 7D, via holes are opened for connecting the first metal interconnection 213 to the second metal interconnection 217. Tungsten is selectively deposited in the via holes using WF$_6$ and SiH$_4$ gases to form the plugs 216. Similar to the first wiring underlayer 213a, Ti and TiN for the second metal underlayer 217a are sequentially deposited to film thicknesses of 50 nm and 70 nm by the sputtering method. An Al-Cu-Si alloy for the main wiring layer 217b is deposited to a thickness of 1,200 nm on this wiring underlayer 217a by the sputtering method to form the metal wiring layer of the multi-layered structure. Subsequently, this metal wiring layer of the multi-layered structure is processed by the lithography and RIE techniques to form the second metal interconnection 217. The obtained structure is annealed in an annealing step at 450° C. for 5 minutes.

The fourth insulation film 219 is deposited to a thickness of 400 nm using TEOS and oxygen (O$_2$) gases in a low-pressure plasma at 400° C. An opening for connecting a lead wire or a bonding wire is formed by the lithography and RIE techniques. As a result, the surface metal interconnection portion is obtained as shown in FIG. 6 (note that the opening for a lead wire connection is not illustrated).

Figure 8:
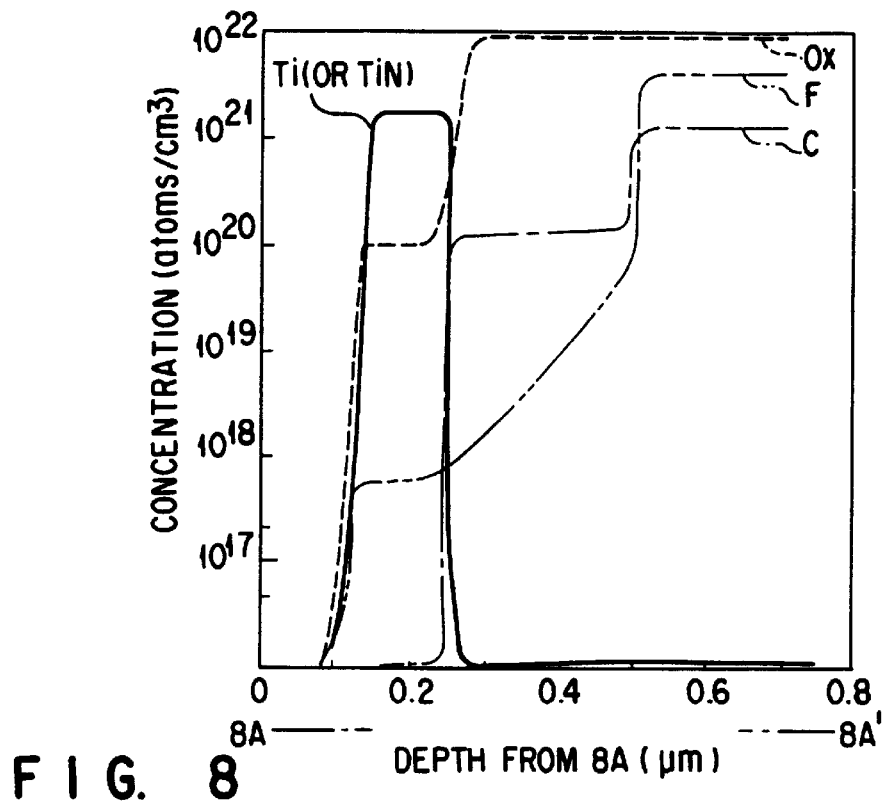
FIG. 8 is a graph showing the concentration profiles of constituent elements on a section taken along a line 8A—8A' in FIG. 6.

FIG. 8 shows the concentration distribution of constituent elements (Ti, F, C, and $O_x$) on a section indicated by a chain line 8A—8A' near the interface between the second metal interconnection 217 and the third insulation film 218, which are obtained in the above manner. The abscissa in FIG. 8 represents the depth from 8A in the direction along the line 8A—8A', and the ordinate represents the concentration of each constituent element. Like in the first embodiment, the fluorine concentration in a region sufficiently spaced apart from the interface of the underlayer 217a (more specifically, a region of a titanium nitride film spaced apart from the interface by 50 nm or more) is about $5 \times 10^{17}$ atoms/cm$^3$, and that at the interface is as low as about $5 \times 10^{18}$ atoms/cm$^3$. It should be noted that the fluorine concentration at a portion corresponding to the third insulation film 218 (a region where the carbon (C) concentration shows a value of about $1 \times 10^{20}$ atoms/cm$^3$) is less than that of the second insulation film 215 (a region where the C concentration shows a value of about $1 \times 10^{21}$ atoms/cm$^3$). This is because fluorine is not originally doped in the third insulation film 218, and the third insulation film 218 contains only fluorine which is diffused from the second insulation film 215 during annealing and remains in the third insulation film 218.

Note that this concentration distribution was obtained by measurement in a state of FIG. 6, wherein the fourth insulation film 219 was formed. It was also confirmed that the same result was obtained on a section taken along the line 8A—8A' in FIG. 7D, wherein the fourth insulation film 219 was not formed yet.

Figure 9:
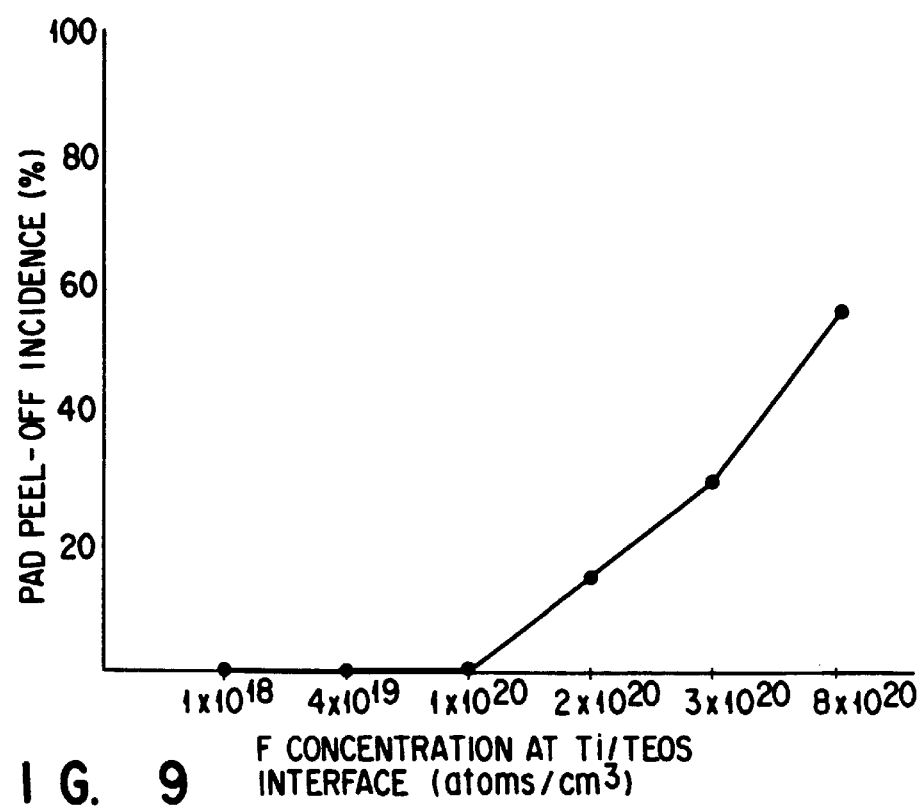
FIG. 9 is a graph showing a relationship between the fluorine concentration at the interface between titanium and a silicon oxide film and the bonding pad peel-off incidence in the second embodiment.

In the multi-layered structure constituted in this manner, the fluorine concentration at the interface between the second metal interconnection 217 and the third insulation film 218 can be changed by changing the annealing conditions and the film formation conditions of the fluorine-doped insulation film. FIG. 9 is a graph showing a relationship between the fluorine concentration on this interface and the pad peel-off incidence during wire bonding. This relationship was examined by changing the fluorine concentration at this interface. The conditions for wire bonding are exactly the same as those in the first embodiment. As is apparent from FIG. 9, pad peel-off does not occur at all if the fluorine concentration is less than $1 \times 10^{20}$ atoms/cm$^3$ in the range where a Ti-based metal had the highest concentration. In this manner, pad peel-off can be avoided by controlling the fluorine concentration at the interface.

Note that SIMS (Secondary Ion Mass Spectrometry) analysis was used for measurement of the fluorine concentration in the refractory metal. TiF was used as a detection ion for quantitative analysis of fluorine in the titanium layer. A Model 6600 available from Perkin Elmer was used for the SIMS. The measurement was carried out under the condition wherein the ionization energy of Cs$^+$ions was 5 keV.

(Third Embodiment)

The above effect can also be obtained in a metal interconnection portion having a structure having a larger number of layers. Next, the third embodiment will be described as an example of a multi-layered interconnection with reference to FIG. 10. This embodiment exemplifies the case wherein one more metal interconnection is stacked on the second metal interconnection of the first embodiment. That is, a third insulation film 222 similar to a second insulation film 215 is formed on a second metal interconnection 217, and plugs 226 consisting of tungsten or the like are formed in predetermined portions of the second metal interconnection. On the upper portion, a third metal interconnection 220 is formed like the second metal interconnection 217. Further, a fourth insulation film (passivation layer) 224 covers the resultant structure.

Figure 11A:
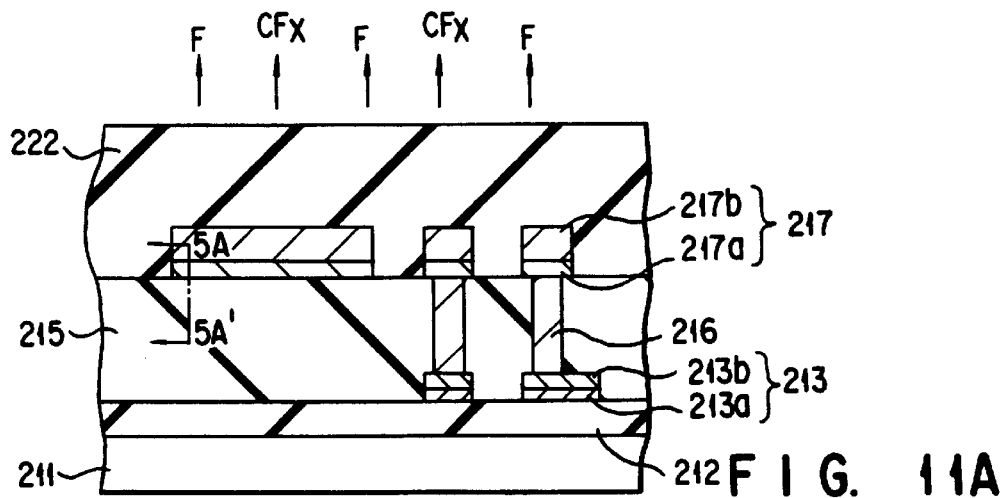
FIGS. 11A and 11B are sectional views of the semiconductor device showing part of a manufacturing method according to the third embodiment of the present invention.
Figure 11B:
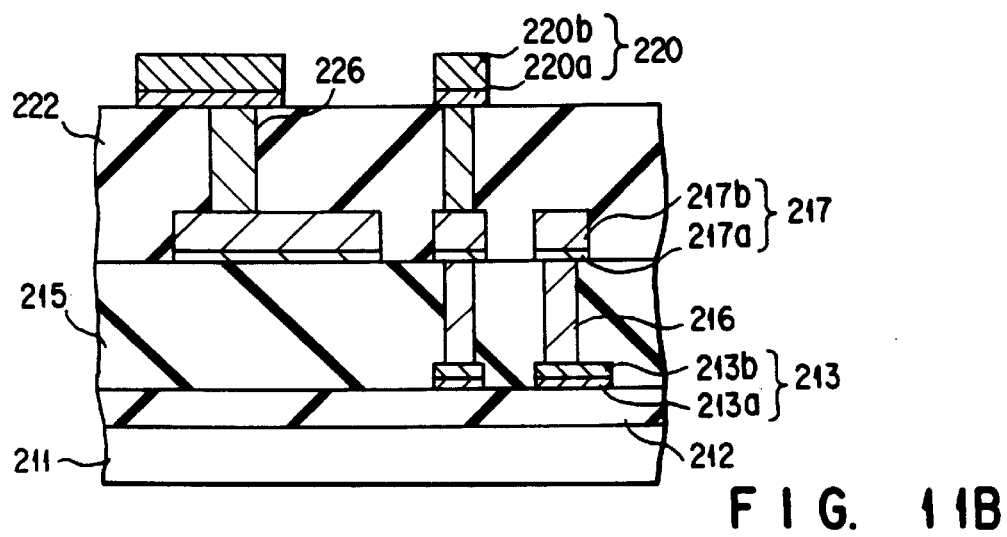

This multi-layered metal interconnection portion is manufactured as shown in FIGS. 11A and 11B. First, the same procedure as in the first embodiment is performed to form up to the second metal interconnection 217. In this stage, the concentration distribution of each constituent element along a line 5A—5A' in FIG. 11A is the same as that in FIG. 5. Then, in the same procedure as for the second insulation film 215, the third insulation film 222 doped with fluorine is formed to a film thickness of 2,500 nm. The surface of this insulation film 222 is planarized by the resist etch-back RIE technique. Subsequently, this substrate is introduced into a furnace in a nitrogen atmosphere at 450° C. to anneal it for 15 minutes. As a result, $CF_x$ and free fluorine are diffused outside the insulation film 222.

Next, as shown in FIG. 11B, via holes are opened for connecting the second metal interconnection 217 to the third metal interconnection 220. Tungsten is selectively deposited in the via holes using $WF_6$ and $SiH_4$ gases to form the plugs 226. Similar to the first wiring underlayer 213a, Ti and TiN for a third wiring underlayer 220a are sequentially deposited to film thicknesses of 50 nm and 70 nm by the sputtering method. An Al-Cu-Si alloy for a main wiring layer 220b is deposited to a thickness of 1,200 nm on this wiring underlayer 220a by the sputtering method to form the metal wiring layer of the multi-layered structure.

Subsequently, this metal wiring layer of the multi-layered structure is processed by the lithography and RIE techniques to form the third metal interconnection 220. The obtained structure is annealed in an annealing step at 450° C. for 5 minutes.

Figure 10:
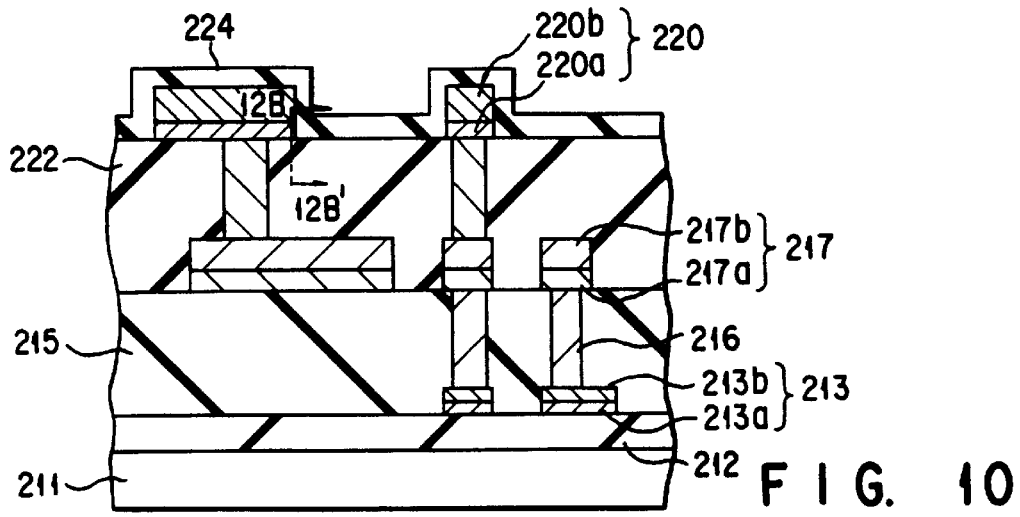
FIG. 10 is a sectional view showing the main part of a semiconductor device according to the third embodiment of the present invention.
Figure 12:
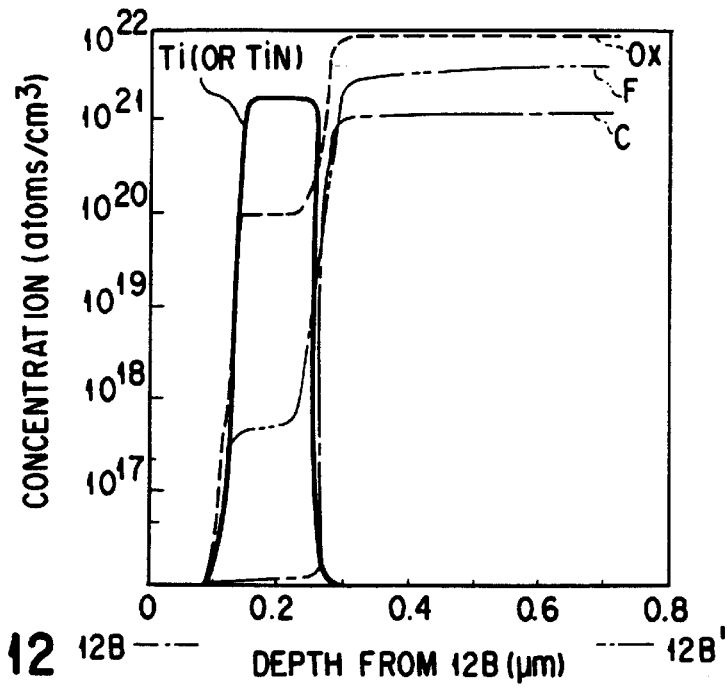
FIG. 12 is a graph showing concentration profiles of constituent elements on a section taken along a line 12B—12B' in FIG. 10.

The fourth insulation film 224 is deposited to a thickness of 400 nm using TEOS and oxygen ($O_2$) gases in a low-pressure plasma at 400° C. An opening for connecting a lead wire or a bonding wire is formed by the lithography and RIE techniques. As a result, the three-layered metal interconnection portion is obtained as shown in FIG. 10 (note that the opening for a lead wire connection is not illustrated). At this time, the concentration distribution of each constituent element on a section taken along a line 12B—12B' in FIG. 10 showed the same result (FIG. 12) as in the first embodiment as shown in FIG. 5. The surface metal interconnection formed in this manner was subjected to a bonding test, like in the first embodiment. It was confirmed that there were no pad peel-off defects caused by bonding.

(Fourth Embodiment)

Figure 13:
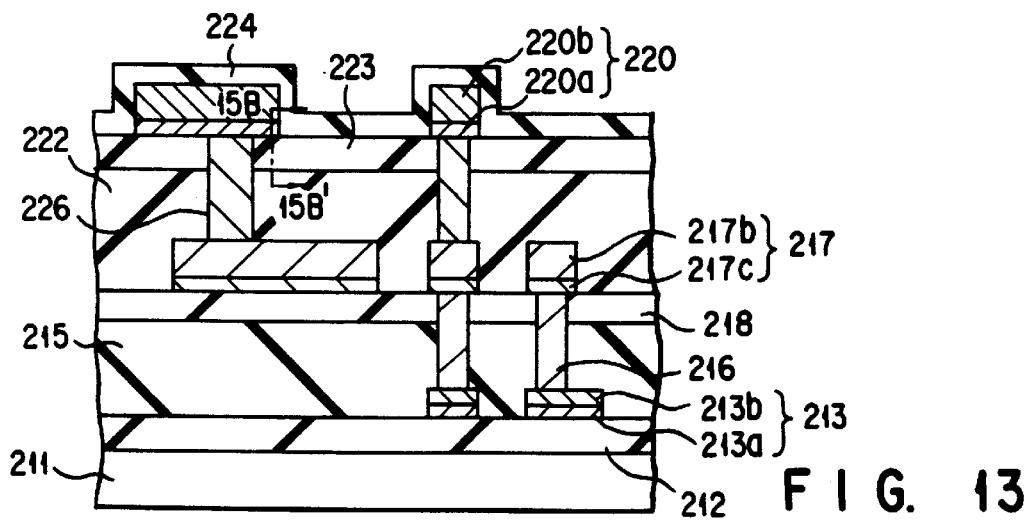
FIG. 13 is a sectional view showing the main part of a semiconductor device according to the fourth embodiment of the present invention.

The fourth embodiment will be described below with reference to FIG. 13. This embodiment exemplifies the case wherein one more metal interconnection is stacked on the second metal interconnection of the second embodiment. That is, a fourth insulation film 222 similar to a second insulation film 215 is formed on a second metal interconnection 217, and a fifth insulation film 223 is further stacked thereon. Plugs 226 consisting of tungsten are formed in predetermined portions of the second metal interconnection 217. On the upper portion, a third metal interconnection 220 is formed like the second metal interconnection 217. Further, a sixth insulation film (passivation layer) 224 covers the resultant structure.

Figure 14A:
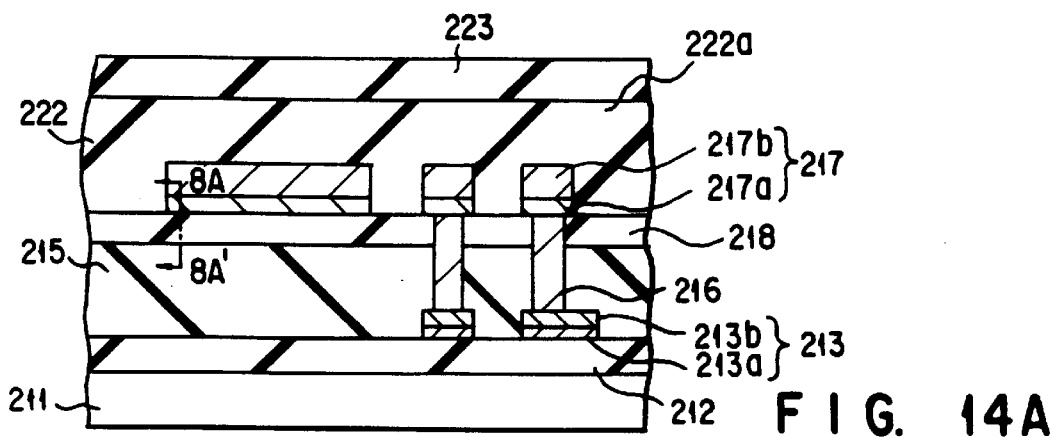
FIGS. 14A and 14B are sectional views of the semiconductor device showing part of a manufacturing method according to the fourth embodiment of the present invention.
Figure 14B:
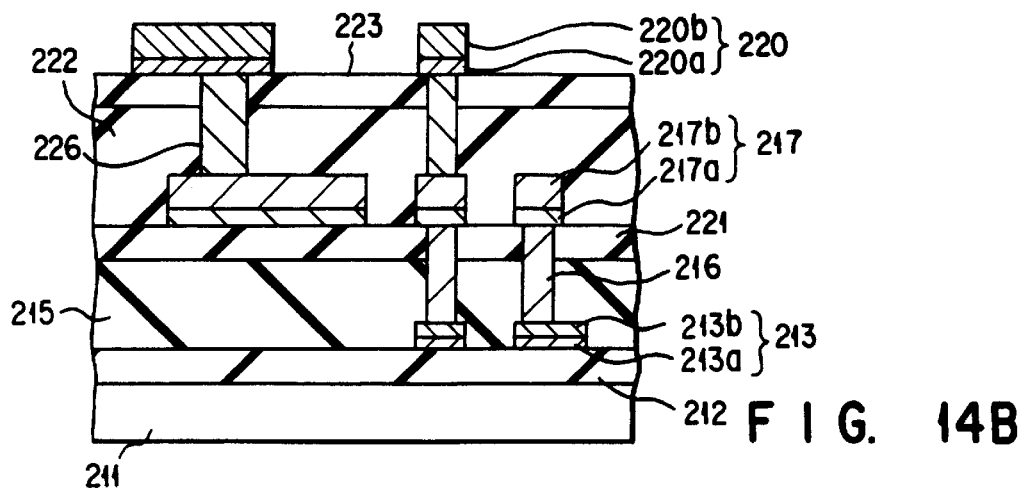

This multi-layered metal interconnection portion is manufactured as shown in FIGS. 14A and 14B. First, the same procedure as in the second embodiment is performed to form up to the second metal interconnection 217. The concentration distribution of each constituent element along a line 8A—8A' in FIG. 14A becomes the same as that in FIG. 8. Then, in the same procedure as for the second insulation film 215, the fourth insulation film 222 doped with fluorine is formed to 2,500 nm. The surface of this insulation film 222 is planarized by the resist etch-back RIE technique. Subsequently, this substrate is introduced into a furnace in a nitrogen atmosphere at 450° C. to anneal it for 15 minutes. As a result, $CF_x$ and free fluorine are diffused outside the insulation film 222.

Subsequently, as shown in FIG. 14A, the fifth insulation film 223 is deposited to a thickness of 300 nm using TEOS and oxygen ($O_2$) gases in a low-pressure plasma. As a film formation gas for the CVD $SiO_2$ film to be used here, inorganic $SiH_4$ may be used instead of TEOS. Further, $O_3$ gas may be used instead of the $O_2$ gas.

Next, via holes are opened for connecting the second metal interconnection 217 to the third metal interconnection 220. Tungsten is selectively deposited in the via holes using $WF_6$ and $SiH_4$ gases to form the plugs 226. Similar to the first wiring underlayer 213a, Ti and TiN for a third wiring underlayer 220a are sequentially deposited to film thicknesses of 50 nm and 70 nm by the sputtering method. An Al-Cu-Si alloy for a main wiring layer 220b is deposited to a thickness of 1,200 nm on this wiring underlayer 220a by the sputtering method to form the metal wiring layer of the multi-layered structure.

Subsequently, this metal wiring layer of the multi-layered structure is processed by the lithography and RIE techniques to form the third metal interconnection 220. The obtained structure is annealed in an annealing step at 450° C. for 5 minutes.

Figure 15:
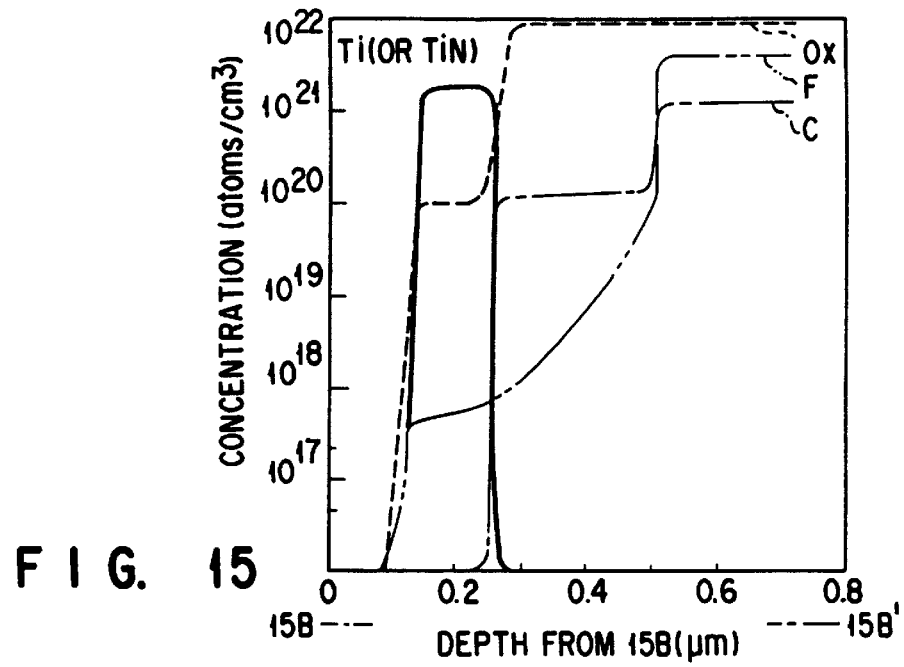
FIG. 15 is a graph showing concentration profiles of constituent elements on a section taken along a line 15B—15B' in FIG. 13.

The sixth insulation film 224 is deposited to a thickness of 400 nm using TEOS and oxygen ($O_2$) gases in a low-pressure plasma at 400° C. An opening for connecting a lead wire or a bonding wire is formed by the lithography and RIE techniques. As a result, the three-layered metal interconnection portion is obtained as shown in FIG. 13 (note that the opening for lead wire connection is not illustrated). At this time, the concentration distribution of each constituent element on a section taken along a line 15B—15B' in FIG. 13 showed the same result as in the second embodiment of FIG. 15. The surface metal interconnection formed in this manner was subjected to a bonding test, like in the second embodiment. It was confirmed that there were no pad peel-off defects caused by bonding.

The formation method for a multi-layered interconnection is not limited to the above embodiments, and various modifications may be effected. For example, it is possible to manufacture an insulation layer between the first and second layers of a three-layered interconnection by the method of the first embodiment, and to manufacture an insulation layer between the second and third layers by the method of the second embodiment.

As described above, the adhesion strength of a multi-layered interconnection, which uses a titanium-based metal formed on an Si-F-containing insulation film as an underlayer, is improved by paying attention to the concentration of fluorine contained in the underlayer. A further analysis of the adhesion mechanism between the underlayer and the insulation film reveals the following fact. When the boundary between the metal wiring underlayer and the insulation film represented by a circle 16 in FIG. 3 is enlarged, a reaction layer 230 several nm thick interposes therebetween, as shown in a photomicrograph of FIG. 16. It is considered that the reaction layer 230 is constituted such that $SiO_2$ contained in the insulation film 215 reacts with Ti of the underlayer to form a reaction product of $Ti_xSi_yO_z$. The constituent elements of the reaction layer obtained in the first embodiment of the present invention and those of the reaction layer obtained in the prior art, in which no fluorine removal process was performed, were analyzed with the EDX (Energy Dispersed X-ray spectrometer), thereby obtaining the following results shown in Table 1.

TABLE 1

| Constituent Element | Content (atomic %) | |
|---|---|---|
| | Embodiment 1 | Prior Art |
| Ti | 7.15 | 38.08 |
| Si | 41.99 | 43.77 |
| F | 0 | 0.64 |
| O | 50.86 | 15.48 |
| N | 0 | 0 |
| C | 0 | 2.03 |

The ratio of Ti to Si and that of Ti to O were calculated from Table 1, and the results are shown in Table 2.

TABLE 2

| | Embodiment 1 | Prior Art |
|---|---|---|
| Ti/Si | 0.17 | 0.87 |
| Ti/O | 0.14 | 2.46 |

From Table 2, it is found that the ratio of Ti to Si in the reaction Layer obtained in the first embodiment is as low as 0.2 or less (Ti/Si<0.2), and the ratio of Ti to O is also as low as 0.2 or less (Ti/O<0.2). On the other hand, both the ratios are as high as 0.8 or more in the reaction layer of the prior art, in which no fluorine removal process is performed.

Figure 17:
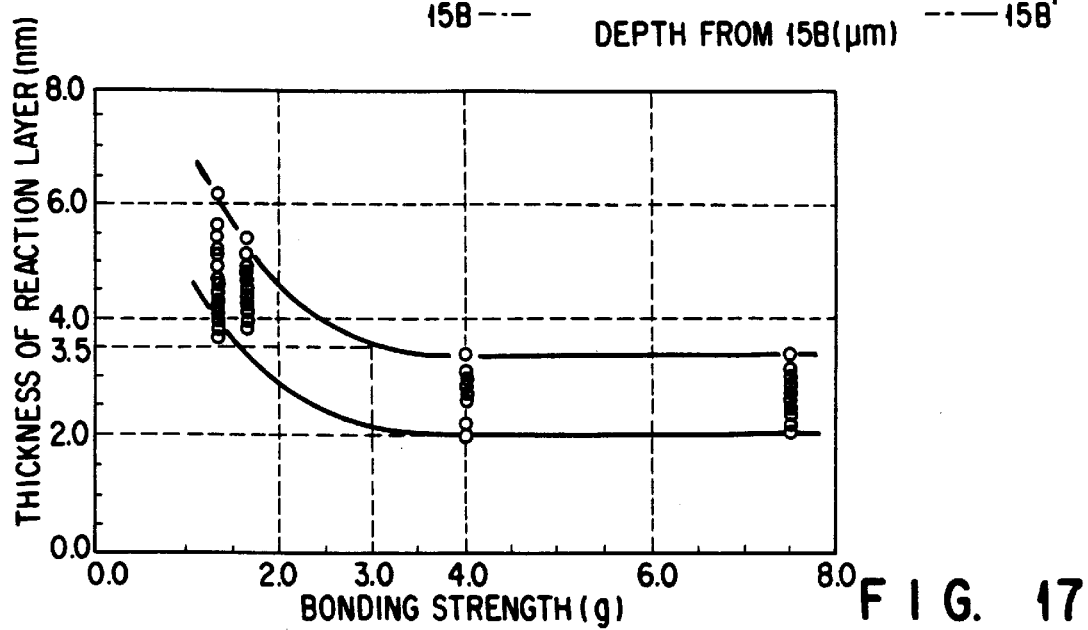
FIG. 17 is a graph showing a relationship between the bonding strength and the thickness of a reaction layer.
Figure 18:
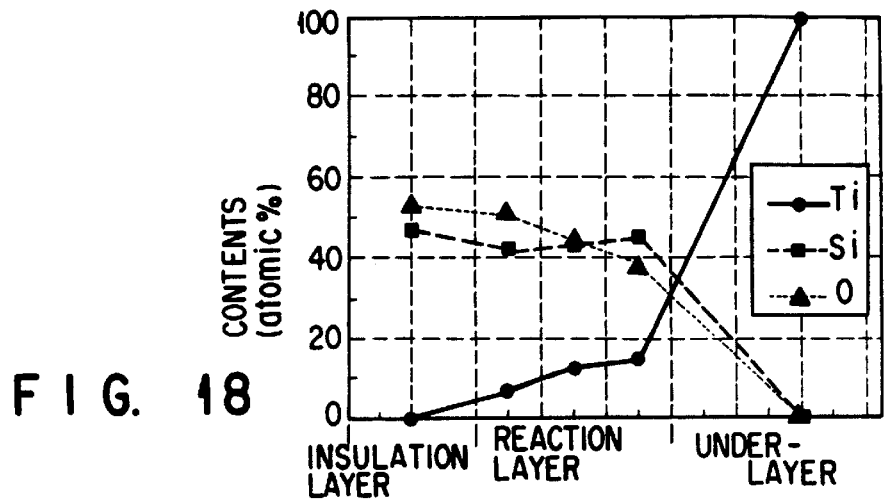
FIG. 18 is a graph showing the constituent ratios of main elements at the interface between an insulation layer and an underlayer in the first embodiment.
Figure 19:
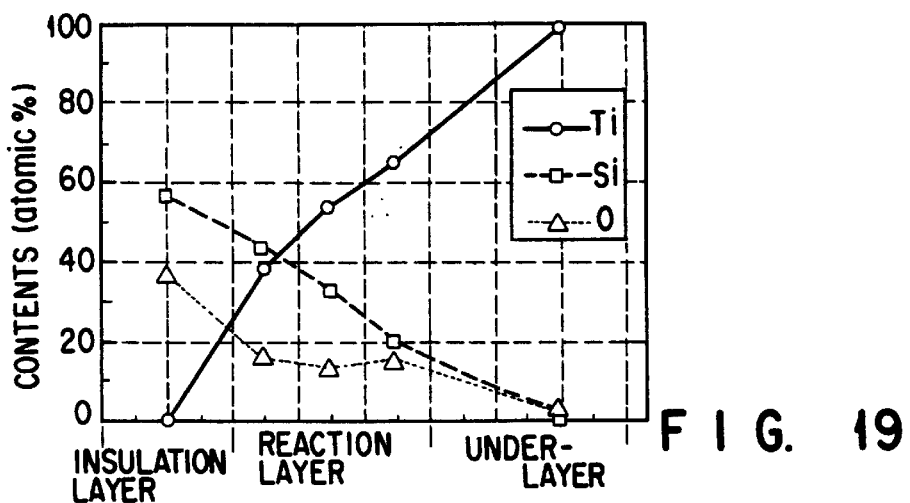
FIG. 19 is a graph showing the constituent ratios of main elements at the interface between an insulation layer and an underlayer in the prior art.

An examination of a relationship between the bonding strength and the thickness of the reaction layer reveals the following results shown in FIG. 17. The strength of 3 g or more, which is considered to be in a good bonding state, is obtained in a reaction layer 3.5 nm or less thick. The ratios of constituent elements of a reaction layer corresponding to a bonding strength of 7.5 g were analyzed with the EDX, and the results are shown in FIG. 18. It is found that the Ti amount in the reaction layer is 100% or less with respect to Si and O. The ratios of constituent elements of a reaction layer corresponding to a bonding strength of 1.5 g were analyzed with the EDX, and the results are shown in FIG. 19. It is found that the Ti amount in the reaction layer greatly exceeds the amounts of Si and O except for a part near the insulation layer. Note that, in FIGS. 18 and 19, each abscissa indicates not actual distances but a schematic positional relationship of measurement points. The thickness of the reaction layer 230 is 2 to 3 nm in FIG. 18, and 4 to 6 nm in FIG. 19.

Figure 20:
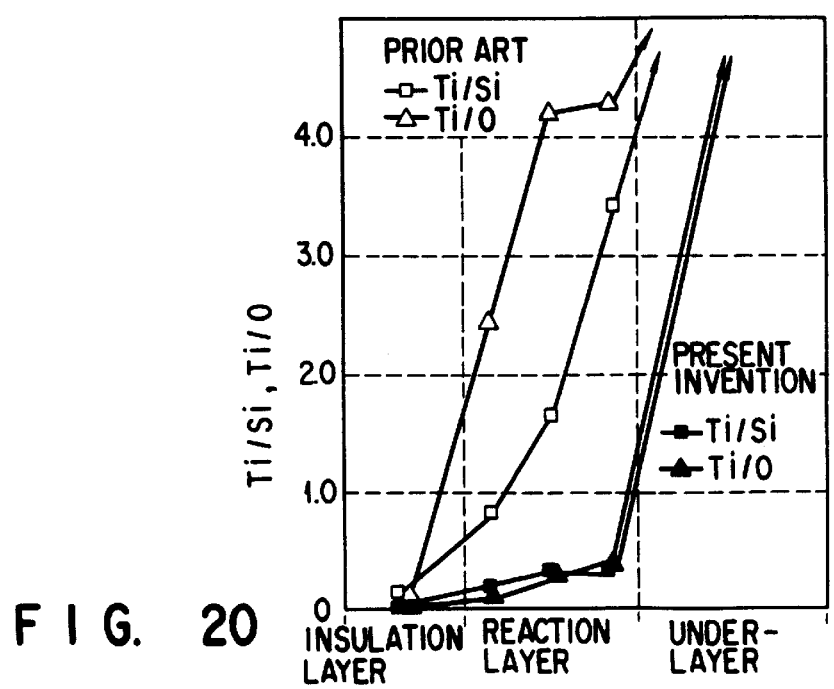
FIG. 20 is a graph showing the ratios of Ti to Si and O at the interface between the insulation layer and the underlayer in the present invention in comparison with those in the prior art.

FIG. 20 shows a comparison between the present invention and the prior art, in which no fluorine removal process is executed, by calculating Ti/Si and Ti/O values. At least on the central portion of a reaction layer in a direction of film thickness, the two ratios of elements are 1.0 or less in the present invention, while those ratios are 1.0 or more in the prior art. That is, the characteristic relationship becomes apparent in which the adhesion strength in the reaction layer having small ratios of Ti to Si and O is superior to the adhesion strength in the prior art. Although this mechanism has not been clarified yet, it is considered that diffusion of F to the Ti layer is greatly involved in this phenomenon.

From the above finding, it was supposed that an increase in adhesion strength of the underlayer could be realized by preventing diffusion of F to the reaction layer. To achieve this prevention of F diffusion, the following embodiments are proposed from a viewpoint different from those of the first to fourth embodiments.

(Fifth Embodiment)

Figure 21:
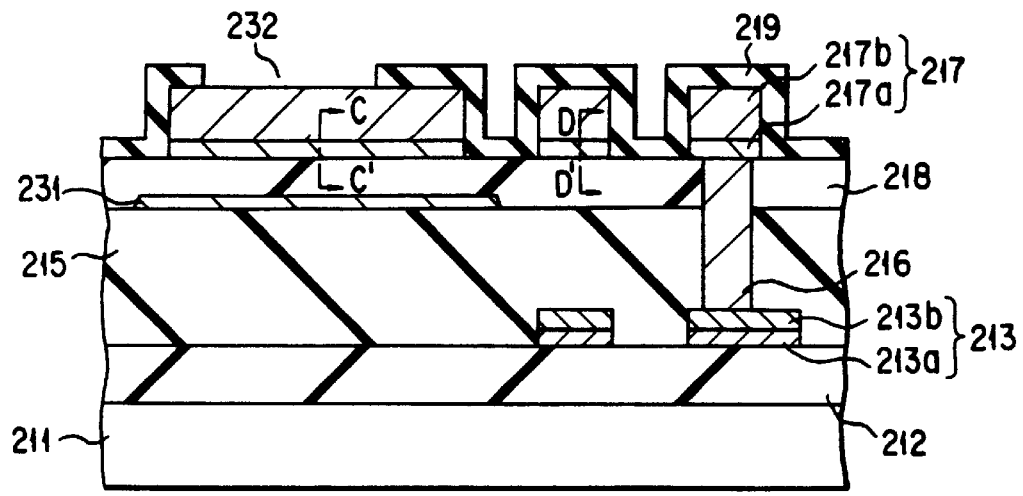
FIG. 21 is a sectional view showing the main part of a semiconductor device according to the fifth embodiment of the present invention.

FIG. 21 is a sectional view showing a metal interconnection portion of a semiconductor device according to the fifth embodiment of the present invention. Referring to FIG. 21, a first insulation film ($SiO_2$) 212 is formed on an Si substrate 211, and a first metal interconnection 213 is partially formed on the surface of the first insulation film 212. This metal interconnection 213 is an interconnection of a multi-layered structure constituted by a titanium-based metal underlayer 213a and a main wiring layer 213b of, e.g., an Al-Cu-Si alloy. A second insulation film 215 is formed in the remaining region of the first insulation film 212. This insulation film 215 is an $SiO_2$ film containing Si-F bonds. The characteristic feature of this embodiment is that a first fluorine diffusion suppression film 231 is formed on this insulation film 215. This fluorine diffusion suppression film 231 may be an insulation film or a conductive film. In the case of an insulation film, an SiN film, an $SiH_4$-$SiO_2$ film formed by an $SiH_4$-based gas, an SiON film doped with oxygen during SiN film formation, or the like can be used. In the case of a conductive film, a polysilicon film, a W-, Ti-, Co- or Ni-based metal silicide film, an Al- or Cu-based metal film, or a multi-layered structure of these films can be employed.

The fluorine diffusion suppression film 231 is processed so as to be selectively arranged under a portion serving as an interconnection region for a bonding wire connection (bonding pad). Thereafter, a third insulation film 218 is formed of, e.g., $SiO_2$ on the fluorine diffusion suppression film 231 and the second insulation film 215. A plug 216 consisting of, e.g., tungsten (W) as a via conductor is formed on the metal interconnection 213. Electrodes are extracted to the surface of the third insulation film 218 through the second insulation film 215 and the third insulation film 218.

A second metal interconnection 217 is formed on the insulation film 218, and part of the second metal interconnection 217 is connected to the plug 216. This metal interconnection 217 is an interconnection of a multi-layered structure constituted by a titanium-based metal underlayer 217a and a main wiring layer 217b of, e.g., an Al-Cu-Si alloy. The insulation film 218 and the metal interconnection 217 are covered with a fourth insulation film (passivation film) 219 to form a surface metal interconnection portion.

The above semiconductor device is manufactured by the following method. Following the same procedures as in the first embodiment shown in FIGS. 4A and 4B, the first insulation film 212, the first metal interconnection 213, and the second insulation film 215 are formed on the substrate 211.

Figure 22A:
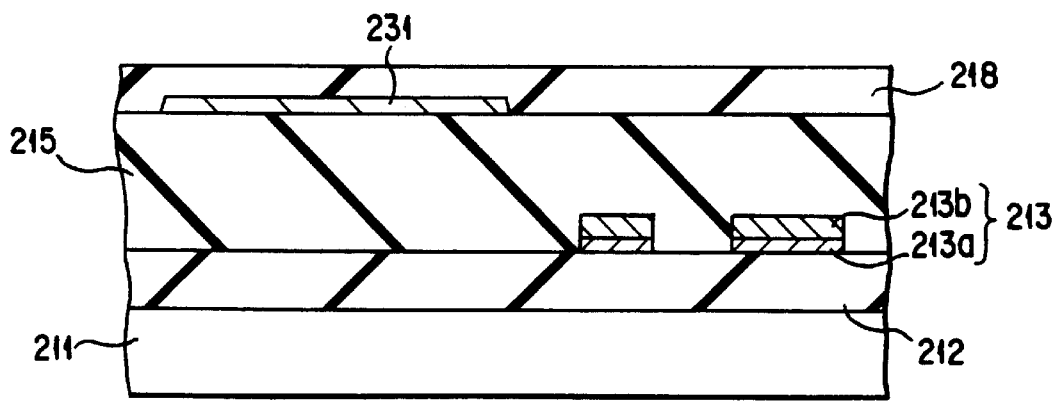
FIGS. 22A and 22B are sectional views of the semiconductor device showing part of a manufacturing method according to the fifth embodiment of the present invention.

Then, as shown in FIG. 22A, e.g., an SiN insulation film as the fluorine diffusion suppression film 231 is deposited to a thickness of 200 nm on the second insulation film 215 containing Si-F bonds by the low-pressure plasma CVD method. Subsequently, the SiN film is etched by the lithography technique and the CDE or RIE technique so as to leave the SiN film only in the region under the pad portion for a bonding wire connection to be formed. The same procedure is performed for use of an $SiH_4$-$SiO_2$ film, an SiON film, a polysilicon film, or a metal film as this fluorine diffusion suppression film 231. Each film is etched by the lithography technique so as to be selectively arranged in the region under the bonding pad. The third insulation film 218 is deposited to a thickness of 300 nm using TEOS and oxygen ($O_2$) gases in a low-pressure plasma.

Figure 22B:
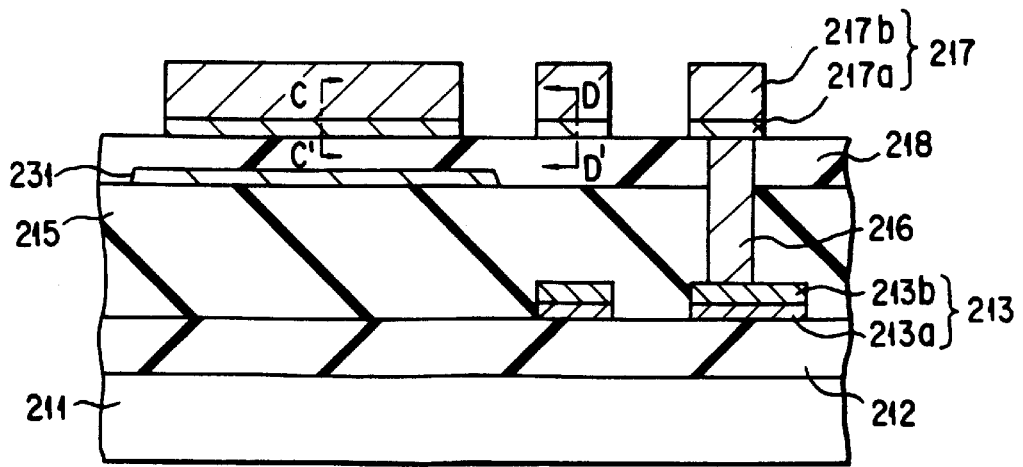

Next, as shown in FIG. 22B, a via hole is opened for connecting the first metal interconnection 213 to the second metal interconnection 217. Tungsten is selectively deposited in the via hole using $WF_6$ and $SiH_4$ gases to form the plug 216. Similar to the first wiring underlayer 213a, Ti and TiN for the second metal underlayer 217a are sequentially deposited to film thicknesses of 50 nm and 70 nm by the sputtering method. An Al-Cu-Si alloy for the main wiring layer 217b is deposited to a thickness of 1,200 nm on this wiring underlayer 217a by the sputtering method to form the metal wiring layer of the multi-layered structure. Subsequently, this metal wiring layer of the multi-layered structure is processed by the lithography and RIE techniques to form the second metal interconnection 217. The obtained structure is annealed in an annealing step at 450° C. for 5 minutes.

The fourth insulation film 219 is deposited to a thickness of 400 nm using TEOS and oxygen ($O_2$) gases in a low-pressure plasma at 400° C. An opening for a bonding pad 232 is formed by the lithography and RIE techniques. As a result, the surface metal interconnection portion is obtained as shown in FIG. 21.

The vicinity of the interface between the second metal interconnection 217 and the third insulation film 218, which were obtained in this manner, was analyzed. As a result, formation of a reaction layer 230 as shown in FIG. 16 was confirmed. The thickness of the reaction layer was 2.6 nm on a section taken along a broken line C—C' in FIG. 22B, and 4.1 nm on a section taken along a broken line D—D'. The ratios of constituent elements in the reaction layer were analyzed with the EDX. The constituent ratios Ti/Si and Ti/O were as low as about 0.3 in the central portion of the reaction layer in a direction of film thickness along the line C—C', while those were higher than 1 in the reaction layer along the line D—D'. That is, it was confirmed that the content of Ti was small in the region (bonding pad region) where the adhesion properties between Ti and $SiO_2$ were to be enhanced. The fluorine concentrations in the Ti underlayer 217a and the reaction layer 230 in FIG. 16 were examined to be less than $1 \times 10^{20}$ atoms/cm$^3$ in the bonding pad 232 region.

The semiconductor device having such a concentration distribution was subjected to an ultrasonic bonding test. A metal wire 25 μm in diameter was bonded between a bonding pad 232 (50×80 μm) having the same arrangement as that of the second metal interconnection 217 on an IC chip and a terminal of a packaging part on which the IC is mounted with a predetermined ultrasonic output and a predetermined load. A tensile test was conducted on 100 bonding wires to check the presence of peel-off defects generated at the interface between the bonding pad and the insulation film 218. As a result, there was no peel-off defect. Consequently, it was apparent that the properties between the metal wiring underlayer 217a and the insulation film 218 could be increased using the technique by which the constituent ratios Ti/Si and Ti/O became less than 1.0.

(Sixth Embodiment)

Figure 23:
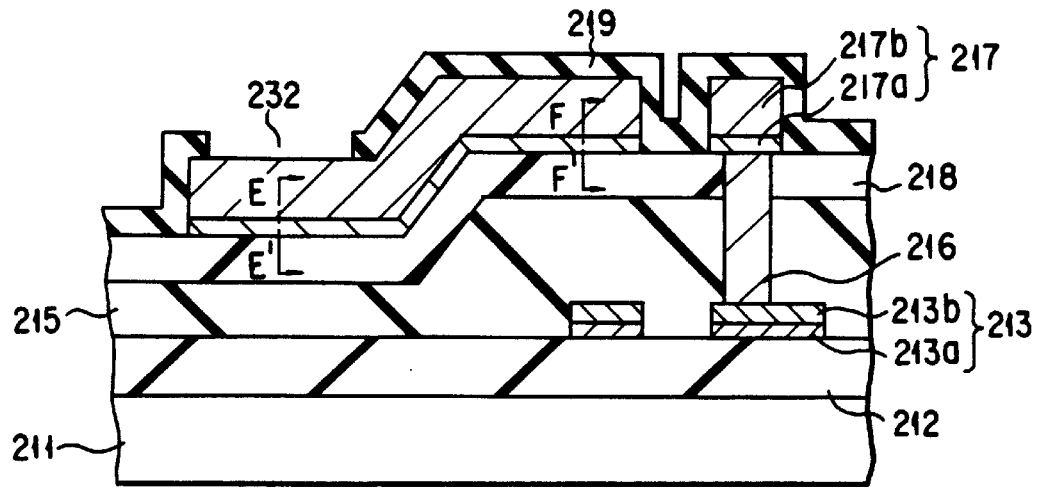
FIG. 23 is a sectional view showing the main part of a semiconductor device according to the sixth embodiment of the present invention.

FIG. 23 is a sectional view showing a metal interconnection portion of a semiconductor device according to the sixth embodiment of the present invention. Referring to FIG. 23, a first insulation film ($SiO_2$) 212 is formed on a silicon substrate 211, and a first metal interconnection 213 is partially formed on the surface of the first insulation film 212. This metal interconnection 213 is an interconnection of a multi-layered structure constituted by a titanium-based metal underlayer 213a and a main wiring layer 213b of, e.g., an Al-Cu-Si alloy. A second insulation film 215 is formed in the remaining region of the first insulation film 212. This insulation film 215 is an $SiO_2$ film containing Si-F bonds. The characteristic feature of this embodiment is to partially remove this insulation film 215. Part or all of the insulation film 215 at a portion serving as an interconnection region for bonding wire connection where the adhesion properties between Ti and $SiO_2$ are to be enhanced is selectively removed by the lithography technique, the CDE or RIE technique, and the like. For example, when the insulation film 215 has a normal thickness of 800 nm, it is removed by a thickness of 600 nm in the region under the bonding pad 232. Although it is considered to thin the overall thickness of the insulation film 215, the capacitance between the interconnections formed on different two layers increases to degrade a high-speed operation. For this reason, it is desirable to thin the insulation film 215 only under the bonding pad 232. A thickness of the insulation film under the bonding pad may be preferably 100 to 600 nm, more preferably 200 to 500 nm.

The above semiconductor device is manufactured by the following method. Following the same procedures as in the first embodiment as shown in FIGS. 4A and 4B, the first insulation film 212, the first metal interconnection 213, and the second insulation film 215 are formed on the substrate 211. Note that, in this embodiment, the thickness of the second insulation film 215 is set to be 800 nm.

Figure 24A:
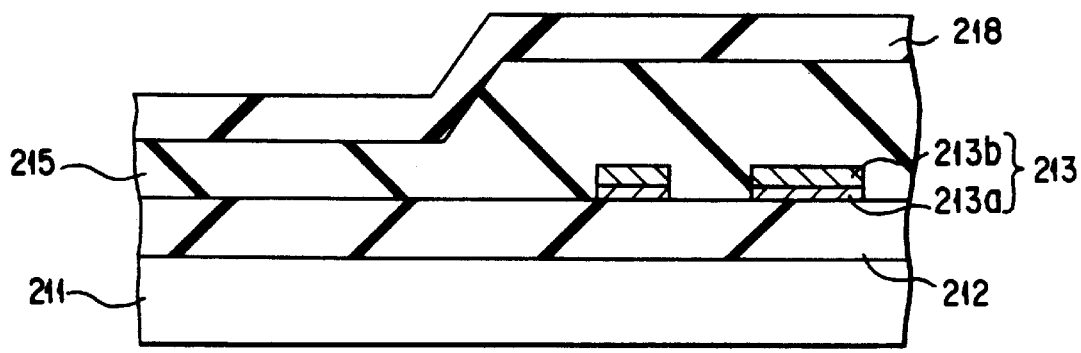
FIGS. 24A and 24B are sectional views of the semiconductor device showing part of a manufacturing method according to the sixth embodiment of the present invention.

Then, as shown in FIG. 24A, the insulation film 215 at a portion under the region where the bonding pad 232 is to be formed is selectively removed by a thickness of 600 nm according to the lithography technique, the CDE or RIE technique, and the like. Subsequently, a third insulation film 218 is deposited to a thickness of 300 nm using TEOS and oxygen ($O_2$) gases in a low-pressure plasma.

Figure 24B:
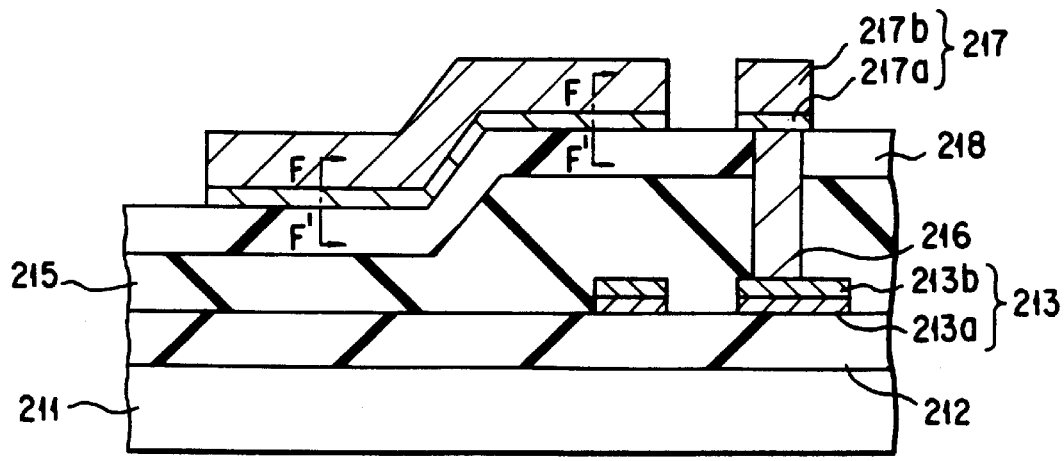

Next, as shown in FIG. 24B, a via hole is opened for connecting the first metal interconnection 213 to the second metal interconnection 217. Tungsten is selectively deposited in the via hole using $WF_6$ and $SiH_4$ gases to form a plug 216. Similar to the first wiring underlayer 213a, Ti and TiN for a second metal underlayer 217a are sequentially deposited to film thicknesses of 50 nm and 70 nm by the sputtering method. An Al-Cu-Si alloy for a main wiring layer 217b is deposited to a thickness of 1,200 nm on this wiring underlayer 217a by the sputtering method to form the metal wiring layer of the multi-layered structure. Subsequently, this metal wiring layer of the multi-layered structure is processed by the lithography and RIE techniques to form a second metal interconnection 217. The obtained structure is annealed in an annealing step at 450° C. for 5 minutes.

A fourth insulation film 219 is deposited to a thickness of 400 nm using TEOS and oxygen ($O_2$) gases in a low-pressure plasma at 400° C. An opening for a bonding pad 232 is formed by the lithography and RIE techniques. As a result, a surface metal interconnection portion is obtained as shown in FIG. 23.

The vicinity of the interface between the second metal interconnection 217 and the third insulation film 218, which were obtained in this manner, was analyzed. As a result, formation of a reaction layer 230 as shown in FIG. 16 was confirmed. The thickness of the reaction layer was 2.7 nm on a section taken along a chain line E—E' in FIG. 23, and 4.0 nm on a section taken along a chain line F—F'. The ratios of constituent elements in the reaction layer were analyzed with the EDX. The constituent ratios Ti/Si and Ti/O were as low as about 0.3 in the reaction layer along the line E—E', while those were higher than 1 in the reaction layer along the line F—F'. That is, it was confirmed that the content of Ti was small in the region where the adhesion properties between Ti and $SiO_2$ were to be enhanced.

The semiconductor device having such a concentration distribution was subjected to an ultrasonic bonding test. A metal wire 25 μm in diameter was bonded between a bonding pad 232 (50×80 μm) having the same arrangement as that of the second metal interconnection 217 on an IC chip and a terminal of a packaging part on which the IC is mounted with a predetermined ultrasonic output and a predetermined load. A tensile test was conducted on 100 bonding wires to check the presence of peel-off defects generated at the interface between the bonding pad 232 and the insulation film 218. As a result, there was no peel-off defect. Consequently, it was apparent that the adhesion properties between the metal wiring underlayer 217a and the insulation film 218 could be increased by decreasing the thickness of the insulation film 215 containing Si-F bonds. This is because the content of fluorine, which is the diffusion source, is originally small in the thin layer.

Note that the present invention is not limited to the above embodiments. In a multi-layered interconnection having three or more layers, the method of the fifth or sixth embodiment is used only for a surface layer, and the method of the first to fourth embodiments or the prior art is used for the remaining lower layers. In the manufacturing method of the fifth and sixth embodiments, the insulation film 218 not containing Si-F radicals is interposed between the insulation film 215 containing Si-F bonds and the metal interconnection 217, but this insulation film 218 can be omitted. Note that, to reliably suppress diffusion of fluorine to the metal interconnection 217, it is desirable to interpose the insulation film 218 not containing Si-F bonds.

In the above-described embodiments, silicon substrates are used for the substrates for the present invention. However, the substrates are not limited to silicon substrates. Any substrate material generally used for a semiconductor device can be used for the present invention.

As has been described above, according to the present invention, the following processes are performed on an insulation film containing Si-F bonds. That is, (1) annealing or plasma processing is performed to remove free fluorine and fluoride bonds whose bonding energy is unstable; (2) a fluorine diffusion suppression film is formed on the insulation film; and (3) the thickness of the insulation film is decreased. Thereafter, a metal interconnection containing Ti is formed on this insulation film. The adhesion properties between the insulation film and the Ti-based metal wiring layer are enhanced by setting the fluorine concentration at the interface between Ti and the insulation film to less than $1\times10^{20}$ atoms/cm$^3$, or by setting the ratios of Ti to Si and to O to 1.0 or less in a reaction layer formed at the interface. Therefore, the semiconductor devices having high reliability wherein no peel-off occurs between Ti and the insulation film can be realized.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:
   a substrate having a first and a second region;
   a first insulating film formed above said substrate and containing silicon-fluorine bonds, said first insulating film having a first thickness on said first region and having a second thickness greater than said first thickness on said second region;
   a titanium-based metal wiring layer formed on said first insulating film; and
   a second insulating film at least formed on said wiring layer and having an opening for wire bonding on said wiring layer above said first region of said substrate.

* * * * *